United States Patent [19]
Russell

[11] Patent Number: 5,121,394
[45] Date of Patent: Jun. 9, 1992

[54] METHOD OF ORGANIZING PROGRAMMABLE LOGIC ARRAY DEVICES FOR BOARD TESTABILITY

[75] Inventor: Robert J. Russell, South Boston, Mass.

[73] Assignee: Bull HN Information Systems Inc., Billerica, Mass.

[21] Appl. No.: 453,645

[22] Filed: Dec. 20, 1989

[51] Int. Cl.[5] .......................................... H04B 17/00
[52] U.S. Cl. ................................. 371/22.1; 371/22.2
[58] Field of Search .................... 371/22.2, 22.6, 22.5, 371/22.1

[56] References Cited

U.S. PATENT DOCUMENTS

| | | | |
|---|---|---|---|
| 4,488,301 | 12/1984 | Nasuta et al. | 371/22.6 |
| 4,546,472 | 10/1985 | Volk et al. | 371/22.1 |
| 4,571,724 | 2/1986 | Belmondo et al. | 371/22.1 |
| 4,973,904 | 11/1990 | Sonnek | 371/22.1 |

OTHER PUBLICATIONS

Mastrocola, Effective Utilization of IN-Circuit Techniques When Testing Complex Digital Assemblies, Aug. 1981.

Primary Examiner—Jerry Smith
Assistant Examiner—Henry C. Lebowitz
Attorney, Agent, or Firm—Faith F. Driscoll; John S. Solakian

[57] ABSTRACT

A system provides for the testing of components which connect to one or more of programmable logic devices (PLDs), each of which is organized in a predetermined manner. Each PLD includes a plurality of programmable logic sections, each of which connect to I/O pins through driver and receiver circuits. An available section includes programmed means for causing its driver circuit to force the I/O pin to a first logic level when made operational. The other sections each include programmed means for connecting their associated driver circuits to be controlled by signals applied to the receiver circuit of the available section. During testing, means are externally applied to the I/O pin of the available section which drive the pin from the first logic level to a second logic level. This causes the receiver circuit to apply signals which inhibit the driver circuits of the remaining sections from applying signals to their I/O pins thereby enabling the testing of components which connect to these I/O pins without interference.

23 Claims, 2 Drawing Sheets

METHOD OF ORGANIZING PROGRAMMABLE LOGIC ARRAY DEVICES FOR BOARD TESTABILITY

BACKGROUND OF THE INVENTION

1. Field of Use

The present invention relates to board testing methods and more particularly to methods of testing boards which include one or more digital programmable logic arrays.

2. Prior Art

As systems become more complex, the printed circuit boards used to construct such systems have increased in terms of circuit density and complexity. To facilitate design, updating or changes in logic circuits, Programmable Logic Devices (PLDs) such as user Programmable Gate Arrays, Programmable Logic Arrays (PLAs) and Programmable Array Logic Devices (PALs) are being used quite extensively. From their origins as a way to collect random logic in a system into a single device, PLDs are taking on a larger and larger role, replacing not only MSI and SSI-type logic but also VLSI peripheral logic functions. PLDs are being used in control functions for cache, random access memory, local bus, interrupt, disks and local-area networks, and as input/output interfaces, timer-counters, and clock generators. This increased use has greatly added to the burden of testing boards which include a number of PLDs.

One efficient way of carrying out board testing is through the use of an in-circuit tester. This type of equipment is usually directed toward testing one board component or element at a time by connecting to etches on the board which directly or indirectly connect to the component to be tested. This connection is often achieved using a bed-of-nails fixture which connects the tester to board etches which might not be accessible via other connection means. When the test is conducted, parts of the board may be forced to assume states which are distinct from their normal operating states. This forcing process is termed overdriving.

In order to be able to carry out testing efficiently on boards containing PLDs, circuit elements are often added during design of boards for purposes of testability. As applied to in-circuit testing, the term "testability" usually refers to the process of preconditioning parts of the board, other than that part or parts intended next to be tested, to assume states which will allow a test to be conducted with a minimum of forcing or overdriving. Further, it has been found that when it is not possible to completely disable a PLD during such testing, it may oscillate when its outputs are overdriven thereby invalidating test results.

The added circuit elements have taken the form of pull-up resistors and etch which connect to spare input pins of these PLDs. In many cases, these elements are added after the logic design is nearly completed. Thus, close coordination is required between the logic designer and test engineer to minimize the number of extra elements such as pull-ups added to the design exclusively for testability purposes. This process can be exceedingly time consuming, tedious and require the expenditure of valuable design resources.

Even after such efforts to include this type of testability, it may not be possible in certain situations to completely test all parts of a board because of on going design revisions or changes requiring certain components to share common pull-up resistors. A shared testability element may result in the conflicting need to force a common point to one logic state for preconditioning of other parts of the board while simultaneously forcing it to the opposite logic state to test a particular part or parts of the board. Testing these parts as a group, to resolve this problem, may not be efficiently accomplished because of tester driver multiplexing or because the individuals normally assigned to write the in circuit tester programs for such boards typically have no need to understand how a particular PLD operates and hence have limited expertise in this area. In practice, automatic test generators are generally used to generate such tests.

Accordingly, it is a primary object of the present invention to provide a more reliable method of testing boards containing programmable logic devices.

It is a further object of the present invention to provide an arrangement which requires the introduction of a minimum amount of additional circuits to a board for enabling testing of an entire board notwithstanding the number and the location of such PLDs on such board.

SUMMARY OF THE INVENTION

The above objects are achieved by the method and preferred embodiment of the present invention. According to such method, an unused or spare input/output (I/O) pin of each PLD used in a printed wire assembly (PWA) is assigned for use during testing as a disable control pin whose output is to be forced from one active state to either the opposite or the inactive state. Stated differently, such I/O pin is driven from a first state to a second state. The states are selected so as to prevent any possibility of producing oscillations as a result of such switching.

The logic section of the PLD which connects to the disable I/O pin is programmed so as to cause the driver circuit to which it connects to force the I/O pin to a first state. The receiver circuit connected to the disable I/O pin internal to the PLD is connected so as to control other output points within the PLD and logically disable the driver or output circuits connected to such pins when the disable control pin is driven to a second state by the testing equipment. More specifically, each PLD output will be prevented from applying output signals to the remaining output pins of the PLD when the receiver circuit is driven to an alternate state. This is accomplished by simply programming or reprogramming each output of the PLD to be controlled by or generated as a function of the state of the input receiver circuit of the designated disable control pin. Other PLD outputs will then be inhibited from applying an output signal to their respective output pins when the disable control pin is driven to an inactive or second state. When using a PLD compiler program, as is customary during design, this is easily done by including additional logic equations as part of the compiler input. This causes the PLD burner equipment to blow the appropriate fuses within the PLD as are required to accomplish such PLD operation.

Additionally, the driver circuit connected to such disable control pin may or may not be also programmed to be disabled in the same manner as the other driver circuits are disabled. This is a function of the designers preference and technology being used.

The above method and arrangement of the present invention provides the advantage of obviating the inclusion of external signal sources such as pull-up resistors and etch to connect such external sources to the PLDs to be disabled. This reduces etch clutter and the likelihood of automatic etch routing disconnect problems.

Also, the arrangement provides for separate or exclusive disabling of each PLD thereby enabling all portions of a board to be tested notwithstanding the number and arrangement of PLDs included on such board. This is particularly advantageous in those instances where one or more PLDs connect in tandem which is frequently the case.

Additionally, the arrangement simplifies reclaiming or reassignment of I/O pins if required for unplanned functional upgrade or modification of the board. This in turn encourages designers to leave spare I/O pins on PLDs to better facilitate board testability. It will be appreciated that, in lieu of an I/O pin, separate spare input and output pins may be similarly programmed to produce similar results, provided the necessary connections are provided between the pins.

The above objects and advantages of the present invention will be better understood from the following description when taken in connection with the accompanying drawings.

DETAILED DESCRIPTION OF THE PREFERRED EMBODIMENT

Figure 1A:
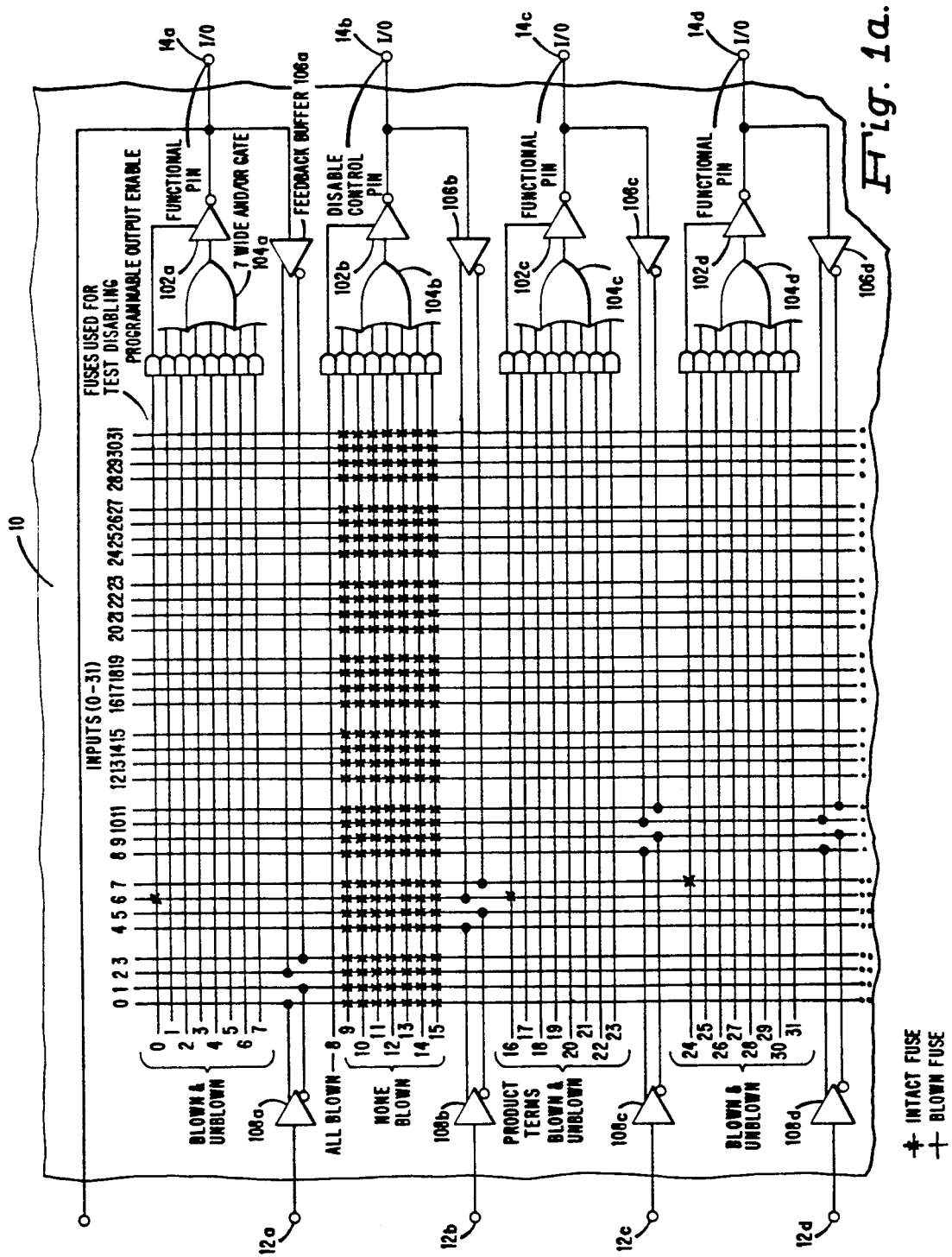
FIG. 1a is a block diagram of a PLD organized according to the principles of the present invention.

FIG. 1a is a block diagram of a portion of a PLD 10 which has been constructed according to the method of the present invention for facilitating the testability of a printed circuit board containing components or parts such as one or more PLDs. Referring to FIG. 1a, it is seen that PLD 10 includes a plurality of input pins 12a through 12d which connect internally to receiver circuits 108a through d which take the form of true and complement buffer circuits as shown.

The PLD 10 also has a plurality of programmable or function I/O pins 14a through 14d which connect internally to driver circuits 102a through 102d which take the form of inverter output buffer circuits. Each output buffer circuit 102 has a programmable output enable (OE) input normally used for tristate operation for logically disconnecting the driver circuit from its I/O pin in a well known manner. The I/O pins also connect internally to receiver circuits 106a through 106d which take the form of feedback true and complement buffer circuits.

As seen from FIG. 1a, the PLD 10 includes a number of seven (7)- wide AND/OR gates 104a through 104d. Typical of standard programmable array (PAL) circuits, array 10 is a matrix (32×32) arranged in a two level AND/OR structure. The first level is the AND array which accepts inputs, performs the desired AND functions on such inputs and applies the function results to the second level OR array. The OR array combines various AND functions together to produce the indicated AND/OR outputs. The AND array is programmable while the OR array is fixed. PAL circuits are frequently used for implementing logical operations in Boolean sum-of-products form.

For the purpose of the present invention, PLD 10 can be considered to comprise the circuits of any standard PAL or PLD part. For further details about the characteristics and programming of PAL devices, reference may be made to the document entitled "Programmable Array Logic Handbook," published by Advanced Micro Devices, Inc., copyrighted 1983.

According to the teachings of the present invention, an unused or spare I/O pin of the PLD 10 is assigned or dedicated for use as a disable control pin. This corresponds to pin 14b in FIG. 1a. In addition to being programmed in a conventional manner, the PLD AND array is also programmed to disable all functional pin outputs from being applied to I/O pins 14 when the disable control pin 14b is driven to a predetermined state during board testing. As discussed herein, the tester forces the output driver from a logical ONE (high) state to a logical ZERO (low) state. It has been found that overdriving high to low is unlikely to cause oscillations in the device used in this example. However, in other designs, it is possible that forcing the driver from a low to high state would be less likely to produce oscillations. In such cases, PLD 10 would be programmed accordingly (i.e., response to opposite logic states).

The above is accomplished by blowing additional fuses in the AND array present in horizontal grid line 8 as shown in FIG. 1a selected to disable all of the output buffer circuits 102 except 102b when I/O pin 14b is driven to the predetermined state. The disabling is accomplished by programming the output enable (OE) gate of each inverter buffer circuit to be disabled as a function of the input signal applied to the disable control pin 14b as explained in greater detail herein.

Figure 2:
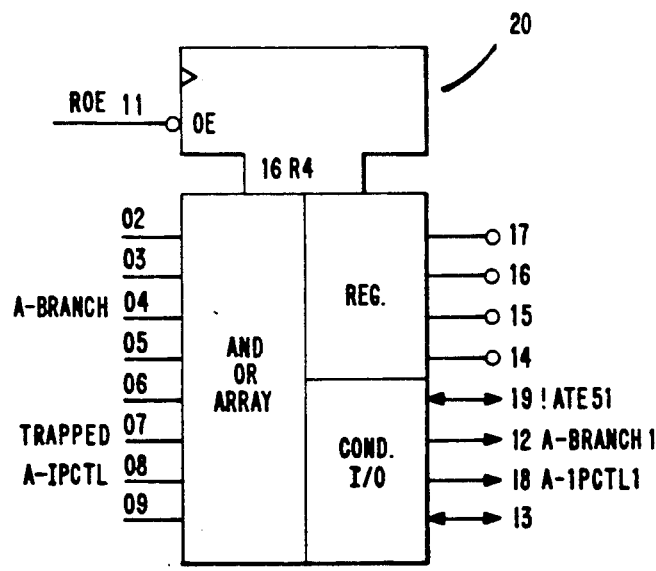
FIG. 2 illustrates another type of PLD organized according to the principles of the present invention.

FIG. 2 shows in block form, a second PLD circuit 20 which takes the form of the AmPAL 16R4 part manufactured by Advanced Micro Devices, Inc. The PAL circuit has been programmed to incorporate the teachings of the present invention. This PAL circuit includes circuits similar to those of FIG. 1a. Additionally, PAL 20 includes register storage into which four AND/OR gate outputs are registered. The OE input pin 11 is used for register tristate operations. This operation is to be controlled by signal !ROE.

Some of the input pins of PAL 20 have signals applied. Pin 19 labeled !ATE51 corresponds to disabling control pin 14b of FIG. 1. The PAL 20 is programmed so that output signals such as signal $A_{13}$BRANCH1 at pin 12 will be disabled as a function of pin 19. The following equations are written in the so-called CUPL logic design language. In such language, the symbol ! represents the negation, and the symbol # represents an OR operation. More specifically, the logic equation for signal A_BRANCH1 is:

!A_BRANCH1 = !A_BRANCH # TRAPPED.

The logic equation for !ATE51 is:

!ATE51 = 'B'1 (is a binary 1).

The following additional equation is added which designates that the OE input is a function of the signal !ATE51 applied to I/O pin 19.

A_BRANCH1.OE = !ATE51.

That is, each of the input or I/O pins can be used to enable or disable output drivers. The present invention makes use of this in programming I/O pin 19.

Similar additional equations are added for the remaining output which is signal A_IPCTL1. That is, another equation such as A_IPCTL1.OE=!ATE51 would be added.

When the above equations, along with the regular equations, are processed or compiled by a software design tool, the equations are converted into a fuse programming information file (JEDEC) which is used to program the PAL 20 in a conventional manner. Once so programmed, PAL 20 can be disabled during board testing as described herein.

DESCRIPTION OF OPERATION

Reference will now be made to FIG. 1a for describing the method and operation of a PLD which incorporates the teachings of the present invention. It will be assumed that PLD 10 has been programmed in the manner described. Accordingly, during the testing of the printed circuit board which contains PLD 10, the testing equipment will be operated to perform in-circuit tests. It is seen that when PLD 10 is being normally operated (i.e., not being driven to any state), it causes disable control pin 19 to be in a binary ONE state.

That is, since all of the fuses to the OE gate have been blown and none of the fuses to the rest of the AND gates of the AND/OR gate 102b have been blown (i.e., all remain in tact), gate 102b will normally assume a binary ONE state. That is, since all ZEROS are present at its inputs, gate 104b forces its output to a ZERO or low which causes the output inverting buffer circuit 102b to force I/O pin 14b to a binary ONE state. The buffer circuit is always enabled because the OE AND gate is always a logic ONE in that no fuses remain connected.

Pin 14b remains in this state providing a binary ONE output until such time it is driven to a binary ZERO state during in-circuit testing. At that time, forcing pin 14b low or to a ZERO causes feedback buffer 106b to force its true output to a binary ZERO state. Since this output has been programmed to connect back to the OE driver input of each output pin, the binary ZERO forces all of the other inverting buffer circuits 102a, 102c and 102d into a tristate condition thereby disabling the PLD outputs. While PLD is so disabled, other components on the printed circuit board can be more effectively tested.

Figure 1B:
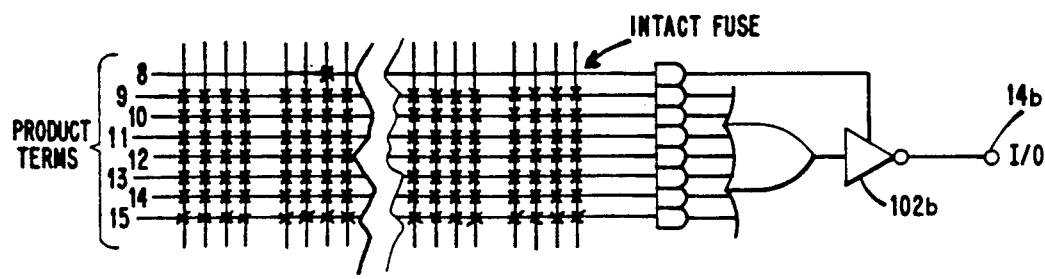
FIG. 1b shows an alternate PLD organization.

In PLD 10 of FIG. 1a, the disable control driver circuit 102b has not been programmed to be similarly disabled. However, as mentioned previously, this is typically not necessary due to the fact that oscillation is unlikely to occur by overdriving the output 102b from a high to low state. When driver circuit 102b is programmed to be disabled along with the other driver circuits, proper circuit operation during times other than testing would depend upon receiver circuit 106b being the type that "floats" to a ONE level whenever the driver circuit 102b is temporarily placed in a disabled state, such as during system power up. FIG. 1b shows an arrangement whereby driver 102b is disabled along with drivers 102a, 102c, and 102d. In this embodiment, driving I/O pin 14b to a binary ZERO state will also disable control driver circuit 102b.

From the above, it is seen how easy it is for any PLD included on the circuit board can be disabled no matter how it is connected within the board. This eliminates the need of having to consider how the PLD has been programmed to generate the various output signals in response to certain input stimuli in order to test the other board components.

It will be obvious that many changes may be made to the preferred method and embodiment of the present invention without departing from its teachings. For example, while the invention was described in terms of having the in-circuit test equipment drive the disable control pin from a binary ONE to a binary ZERO, the PLD could be easily programmed to operate in the reverse fashion. Also, the invention is not limited to the type of PLD or to any programming language. Also, the receiver 106b could be utilized to cause other changes within the PLD, such as to turn off a signal generating circuit such as an internal oscillator circuit. Also, in lieu of causing output drivers to assume a non-driving state, the PLD could also be programmed to have such output drivers assume any known state convenient for test purposes.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A method of organizing a programmable logic device (PLD) for facilitating the testing of components connected to said PLD when a printed circuit board including the PLD is connected for testing, said PLD including a plurality of programmable logic sections, each section being connected to at least one output or I/O pin through associated driver or driver/receiver circuits respectively, said method comprising the steps of:

(a) programming an available one of said logic sections having an I/O pin in a predetermined manner so as to cause said output driver circuit to force said I/O pin to a first logic level;

(b) programming remaining logic sections for carrying out desired logic functions during normal operations by connecting their corresponding driver circuits to be controlled by signals applied to said receiver buffer circuit of said available one of said sections; and (c) connecting said I/O pin of said available one of said sections to be driven externally from said first logic level to a second logic level causing said receiver buffer circuit to automatically inhibit said driver circuits of said remaining programmed sections from driving said output or I/O pins associated therewith enabling testing of components connected to said PLD without interference.

2. The method of claim 1 wherein step (a) includes the step of programming said one logic section so that said driver circuit is connected to be responsive to signals from said buffer circuit and wherein step (c) also includes the step of disabling said driver circuit of said one array section by forcing said I/O pin from said first logic level to said second logic level.

3. The method of claim 1 wherein step (c) further includes the step of enabling said driver circuit of said one logic section during the time that said I/O pin is forced from said first logic level to said second logic level.

4. The method of claim 1 wherein said I/O pin of said one logic section consists of an input pin and output pin which are externally connected together, said input pin being connected to said buffer circuit and said output pin being connected to said driver circuit.

5. The method of claim 1 wherein step (b) further includes the step of programming said remaining logic sections so that said driver circuits assume a known state to facilitate testing of said other components.

6. The method of claim 1 wherein each driver circuit includes a tristate input for forcing said driver circuit to a high impedance state so as to disable its operation, said step (b) further including programming said remaining logic sections for connecting said buffer circuit of said one logic section to said tristate inputs of said driver circuits and said step (c) further including the step of said buffer circuit enabling said tristate inputs when said I/ pin is driven to said second logic level for placing said driver circuits in said high impedance state inhibiting said driving of said I/O pins.

7. The method of claim 1 wherein step (c) further includes externally driving from first to second states selected so as to prevent the likelihood of circuit oscillations internally within said PLD when externally driven.

8. The method of claim 7 wherein said PLD is constructed from TTL technology and wherein said first and second states correspond to driving said I/O pin from a high or binary ONE voltage level to a zero or binary ZERO voltage level.

9. The method of claim 1 wherein said driver circuits include a tristate enable input and step (a) further includes the step of programming the inputs which connect to said tristate enable input to cause said driver circuit to be continuously enabled and programming inputs which connect as an AND gate input to an OR gate to force said driver circuit to said first state.

10. The method of claim 1 wherein each driver circuit is an inverting driver circuit and wherein each AND gate input applies a binary ZERO signal to said OR gate causing said driver circuit to apply a binary ONE to said output or I/O pin during normal operation.

11. The method of claim 1 wherein said PLD further includes a signal generating circuit and wherein said step (b) further includes the step of programming said one section to connect said buffer circuit to said signal generating circuit for placing said signal generating circuit in a state for preventing signal generation which facilitates testing of said components when said I/O pin is driven to said second state.

12. A method of organizing a programmable logic device (PLD), said PLD including a plurality of AND/OR array sections, each section being connected to a different I/O pin and including a grid of fusible links connected to a corresponding number of AND gates whose outputs connect to an OR gate, said OR gate being connected to an output driver circuit connected to said I/O pin in common with an input receiver buffer circuit connected to apply a signal received from said I/O pin to said grid of fusible links, said method comprising the steps of:

(a) programming said grid of fusible links of an available one of said AND/OR array sections connected to said I/O pin in a predetermined manner so as to cause said output driver circuit to force said I/O pin to a first logic level;

(b) programming said grid of fusible links of remaining AND/OR array sections for carrying out desired logical functions during normal operations and for connecting their corresponding driver circuits to be controlled by signals applied to said receiver buffer circuit of said available one of said AND/OR arrays; and (c) connecting said I/O pin of said available one of said sections to be driven externally from said first logic level to a second logic level causing said receiver buffer circuit to automatically inhibit said driver circuits of said remaining programmed AND/OR array sections from driving said I/O pins associated therewith enabling testing of components connected to said PLD without interference.

13. The method of claim 12 wherein step (a) includes the step of programming said grid of fusible links of said one array sections so that said driver circuit is connected to be responsive to signals from said buffer circuit and wherein step (c) also includes the step of disabling said driver circuit of said one array section by forcing said I/O pin from said first logic level to said second logic level.

14. The method of claim 13 wherein said I/O pin of said one array section consists of an input pin and an output pin externally connected together, said input pin being connected to said buffer circuit and said output pin being connected to said driver circuit.

15. The method of claim 12 wherein step (c) further includes the step of enabling said driver circuit of said one array section during the time that said I/O pin is forced from said first logic level to said second logic level.

16. The method of claim 12 wherein step (b) further includes the step of programming said fusible links of said remaining AND/OR array sections so that said driver circuits assume a known state to facilitate testing of said other components.

17. The method of claim 12 wherein each driver circuit includes a tristate input for forcing said driver circuit to a high impedance state so as to disable its operation, said step (b) further including programming said fusible links of said remaining AND/OR array sections for connecting said buffer circuit of said one array section to said tristate inputs of said driver circuits and said step (c) further including the step of said buffer circuit enabling said tristate inputs when said I/O pin is driven to said second logic level for placing said driver circuits in said high impedance state inhibiting said driving of said I/O pins.

18. The method of claim 12 wherein step (c) further includes externally driving from first to second states selected so as to prevent the likelihood of circuit oscillations internally within said PLD when externally driven.

19. The method of claim 18 wherein said PLD is constructed from TTL technology and wherein said first and second states correspond to driving said I/O pin from a high or binary ONE voltage level to a zero or binary ZERO voltage level.

20. The method of claim 12 wherein each of said driver circuits includes a tristate enable input and step (a) further including the step of blowing all of said fusible links which connect to said tristate enable input causing said driver circuit to be continuously enabled and blowing none of all of said fusible links which connect as an AND gate input to said OR gate to force said driver circuit to said first state.

21. The method of claim 12 wherein each driver circuit is an inverting driver circuit and wherein each AND gate input applies a binary ZERO signal to said OR gate causing said driver circuit to apply a binary ONE to said I/O pin during normal operation.

22. The method of claim 12 wherein said PLD further includes a signal generating circuit and wherein said step (b) further includes the step of programming said grid of fusible links to connect said buffer circuit of said one array section to said circuit for placing said signal generating circuit in a state for preventing signal generation which facilitates said testing of said components when said I/O pin is driven to said second state.

23. A system for facilitating the testing of components, one or more of which connect to a number of programmable logic devices (PLDs), each PLD including a plurality of programmable logic sections, each section being connected to at least one output or a different I/O pin through associated driver or drive/- receiver circuits respectively which connect in common to said I/O pin. each PLD further including:

first programmed means included in an available one of said sections for causing said driver circuit to force said I/O pin to a first logic level when power is applied to said each PLD;

second programmed means included in remaining sections for carrying out specified logic functions and for connecting their driver circuits to be controlled by signals applied to said receiver circuit of said available section; and means connecting said I/O pin of said available section to be driven externally from said first logic level to a second logic level causing said receiver circuit to inhibit said driver circuits of said remaining sections from driving said output or I/O pins associated therewith facilitating testing of said component connected to said number of PLDs without interference.

* * * * *